(12) United States Patent
Rahman et al.

(10) Patent No.: US 7,486,941 B2
(45) Date of Patent: Feb. 3, 2009

(54) METHOD AND APPARATUS FOR DYNAMIC GAIN AND PHASE COMPENSATIONS

(75) Inventors: Mahibur Rahman, Lake Worth, FL (US); Charles L. Sobchak, Davie, FL (US); James David Hughes, Boynton Beach, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 485 days.

(21) Appl. No.: 11/099,278

(22) Filed: Apr. 4, 2005

(65) Prior Publication Data

US 2006/0223463 A1   Oct. 5, 2006

(51) Int. Cl.
*H04B 1/26* (2006.01)
(52) U.S. Cl. .................. 455/234.1; 455/250.1
(58) Field of Classification Search .......... None
See application file for complete search history.

(56) References Cited

U.S. PATENT DOCUMENTS 6,668,164 B2   12/2003   Hughes
2003/0027538 A1 *   2/2003   Masumoto et al. ....... 455/234.1
2004/0014450 A1   1/2004   Yamamoto et al.
2005/0069055 A1   3/2005   Song et al.

\* cited by examiner

*Primary Examiner*—Thanh C Le
(74) *Attorney, Agent, or Firm*—Ingrassia Fisher & Lorenz, P.C.

(57) ABSTRACT

Dynamic gain and phase compensation is provided in a radio frequency (RF) receiver (106) including at least one switched Low Noise Amplifier (LNA) (212) coupled to an RF gain control unit (226) providing a gain control signal to the at least one switched LNA (212) for control thereof. The RF receiver also includes an analog-to-digital (A/D) converter (222) for digitizing the RF signal and outputting an N-bit digital signal to the RF gain control unit (226). The method for gain compensation includes dynamically adjusting the N-bit digital signal to compensate for the at least one switched LNA (212) in response to the gain control signal. The method for phase compensation includes dynamically normalizing the N-bit digital signal into an M-bit signal range to derive an M-bit digital signal, where $M \leqq N$ and dynamically phase adjusting the M-bit digital signal to compensate for the at least one switched LNA (212) in response to the gain control signal.

18 Claims, 5 Drawing Sheets

METHOD AND APPARATUS FOR DYNAMIC GAIN AND PHASE COMPENSATIONS

FIELD OF THE INVENTION

The present invention generally relates to radio frequency (RF) receivers, and more particularly relates to dynamic gain and phase compensations in an RF receiver.

BACKGROUND OF THE INVENTION

Switched Low Noise amplifiers (LNAs) are commonly used in wireless radio frequency (RF) receivers to sufficiently amplify the desired signal at a given sensitivity with minimum added noise. Therefore, under very weak signal conditions, these LNA stages must be turned on. Alternately, under strong signal levels, these switched LNA stages must be turned off to avoid compressing downstream RF and IF stages. An automatic gain control (AGC) unit is typically used to control the states of these switched LNA stages under various weaker and stronger input signal conditions. When such an RF gain control unit dynamically changes the state of these switched LNA stages, it leads to an abrupt gain (e.g., >16 dB) and phase (e.g., >70 degrees) discontinuities in the received signal.

Accordingly, it is desirable to compensate for such large gain and phase discontinuities in a controlled manner to avoid gain transients and phase discontinuities which can otherwise occur. In addition, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
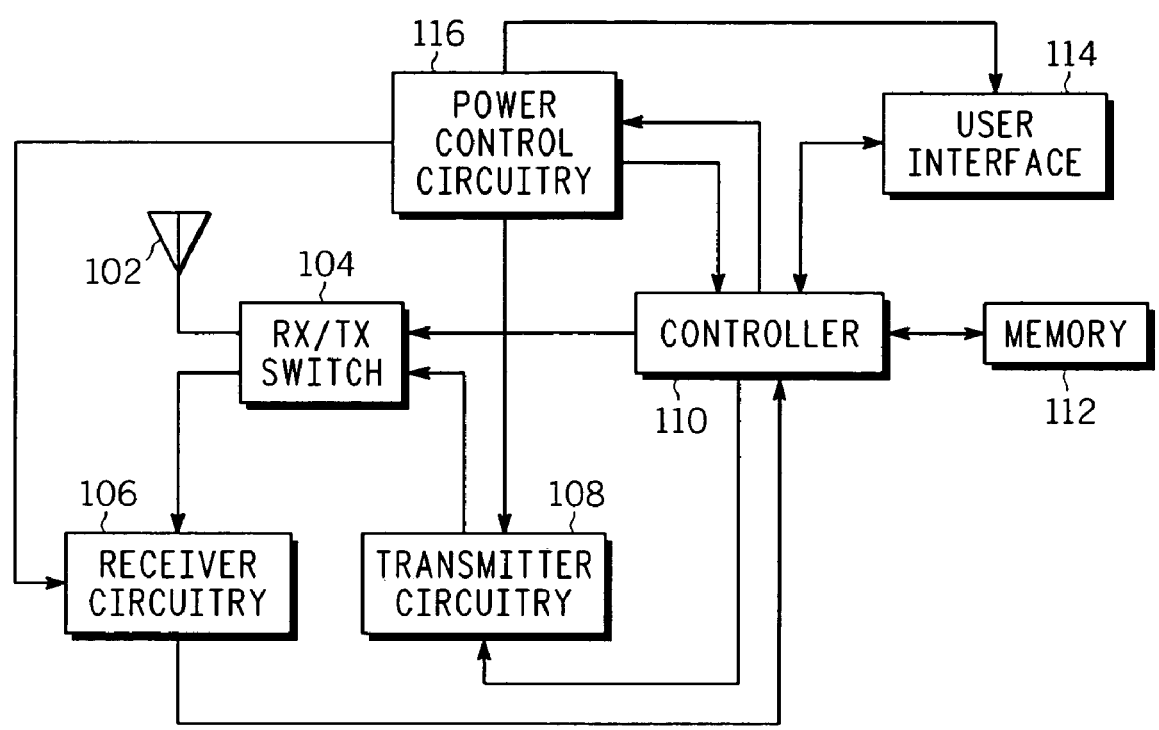
FIG. 1 is a block diagram of an electronic communication device in accordance with a preferred embodiment of the present invention.

Referring to FIG. 1, a block diagram of an electronic communication device 100, such as a cellular telephone, is shown. Although the electronic communication device 100 is depicted as a cellular telephone, the electronic communication device can be implemented as a pager, a laptop computer with a wireless connection, a personal digital assistant with wireless connection, or the like. The electronic communication device 100 includes an antenna 102 for receiving and transmitting radio frequency (RF) signals. A receive/transmit switch 104 selectively couples the antenna 102 to receiver circuitry 106 and transmitter circuitry 108 in a manner familiar to those skilled in the art. The receiver circuitry 106 demodulates and decodes the RF signals to derive information and is coupled to a controller 110 for providing the decoded information thereto for utilization thereby in accordance with the function(s) of the electronic communication device 100.

The controller 110 also provides information to the transmitter circuitry 108 for encoding and modulating information into RF signals for transmission from the antenna 102. As is well-known in the art, the controller 110 is typically coupled to a memory device 112 and a user interface 114 to perform the functions of the electronic communication device 100. Power control circuitry 116 is coupled to the components of the electronic communication device 100, such as the controller 110, the receiver circuitry 106, the transmitter circuitry 108 and/or the user interface 114, to provide appropriate operational voltage and current to those components. The user interface 114 may include one or more user interface devices such as a microphone, a speaker, key inputs, such as a keypad and a display for displaying information to a user and which may also accept touch screen inputs.

Figure 2:
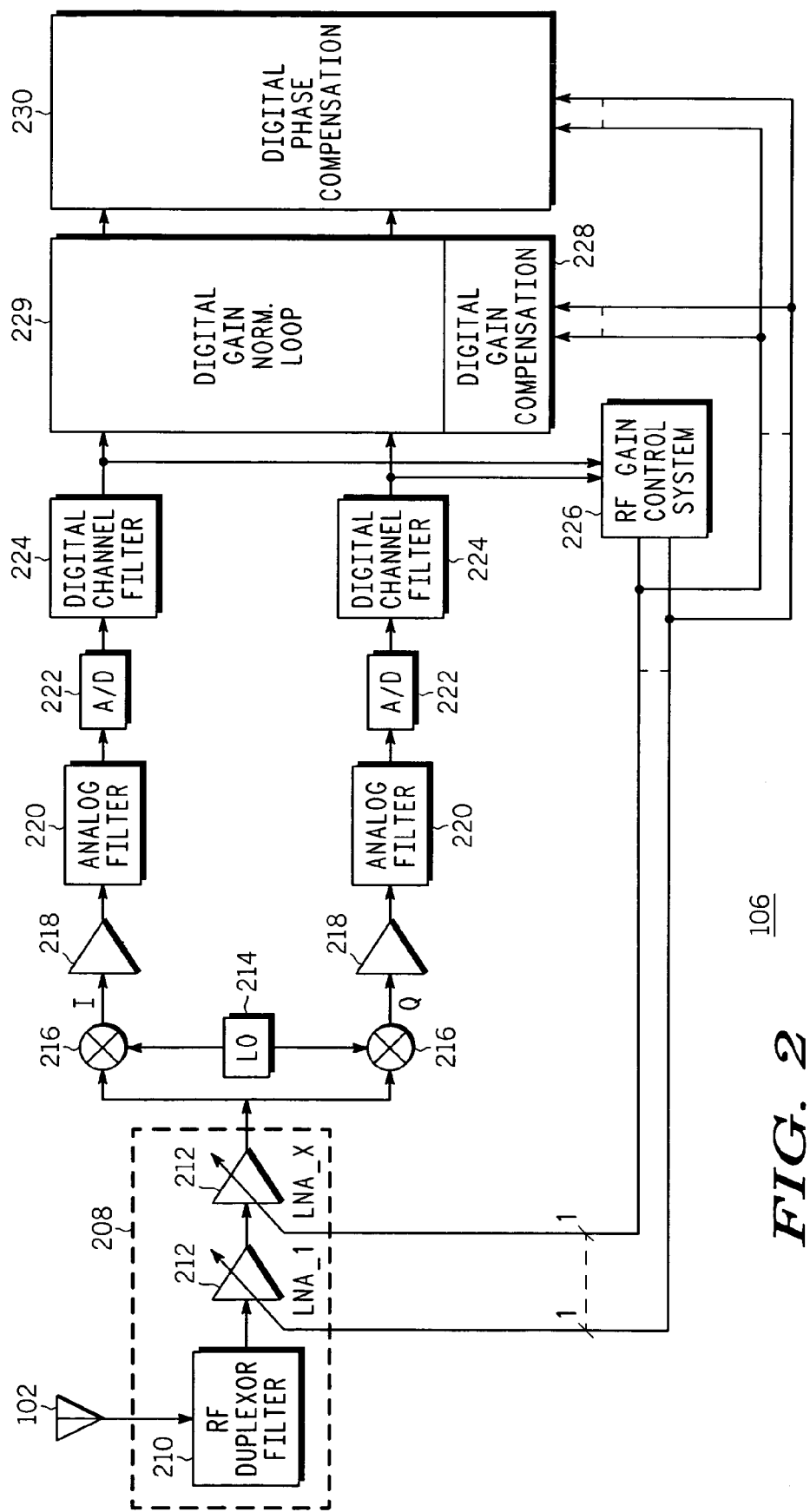
FIG. 2 is a block diagram of a radio frequency receiver of the electronic communication device of FIG. 1 in accordance with a preferred embodiment of the present invention.

Referring to FIG. 2, a low cost and power efficient high performance RF receiver 106 in accordance with the present invention includes an RF frontend section 208. The RF frontend section 208 of the receiver 106 includes an RF duplexor filter 210 and one or more stages of switched Low Noise Amplifier (LNA) stages 212 (shown as Switched LNA_1 to Switched LNA_X). The RF frontend section 208 amplifies the RF signal from the antenna 102 (FIG. 1) and selects the desired RF frequency band.

Following the RF frontend section 208, I/Q quadrature mixers 216 for each quadrature path (I and Q) are employed to convert the RF signal to a low or zero Intermediate Frequency (zero IF) by mixing the received signal with the output of a lowband oscillator (LO) 214. Next, a baseband gain control stage such as a Post Mixer Amplifier (PMA) 218 is used to provide the desired baseband analog gain. After the baseband gain control stage 218, active analog filter stages 220 are used to provide the necessary clipping protection against interferers and high dynamic analog-to-digital (A/D) converters 222 provide A/D anti-aliasing protection. The high dynamic range A/D converters 222 allow the use of minimal analog filtering (for mainly anti-aliasing clipping protection purposes) so that most of the channel selectivity is performed in the digital section of the receiver 106. Digital filters 224 provide the necessary channel filtering and droop/group delay compensation.

In accordance with the present invention, following the digital channel filtering 224, a digital gain normalization loop 228 is employed to minimize the receiver bit width after channel filtering 224. This can be done since the additional bits reserved for digital channel selectivity purposes are no longer required after the digital channel filters 224. A digital gain normalization loop 228 allows for smooth adaptation of the input signal into the new output signal range without causing larger abrupt steps in the specified output signal. Following the digital gain normalization loop 228 is a digital phase compensation block 230 which dynamically compensates for the signal phase shifting caused by increasing or decreasing the gain of the LNA stages 212. Also coupled to the digital gain normalization loop 228 is a digital gain compensation block 229 which dynamically compensates for the signal gain discontinuities caused by increasing or decreasing the gain of the LNA stages 212. While the preferred embodiment of the present invention describes performance of gain and phase compensation of received signal due to LNA 212 state changes, the present invention may also be advantageously utilized to perform gain and phase compensation of the received signal to compensate for state changes of any RF/IF analog stage of the RF or intermediate frequency (IF) portion such as the LNA 212, the mixer 216 or the baseband gain control stage 218.

Also following the digital channel filters 224, there is an RF gain control unit 226 which detects the on-channel signal level to dynamically control the state of the switched LNA stages 212. Under weaker signal conditions, these LNA's 212 are turned on. Alternately, under stronger signal conditions these LNA's 212 are gradually switched off to avoid compressing downstream RF and IF stages. In accordance with the present invention, the RF gain control system 226 passes the current state of the external LNA's 212 to both the digital gain compensation block 229 as well as the phase compensation unit 230. Whenever the state of any of the switched LNA's 212 is altered during normal continuous receive operation, dynamic gain and phase compensation steps are performed with the digital gain compensation block 229 and the phase compensation block 230 to instantaneously compensate for large gain steps (e.g., >16 dB) and phase steps (e.g., >80 degrees) caused by the stepped LNA's 212. These dynamic gain and phase step compensations are performed within the digital portion of the receiver 106 to avoid long undesirable gain and phase transients and discontinuities that can otherwise occur at the input to the signal demodulator (not shown).

Figure 3:
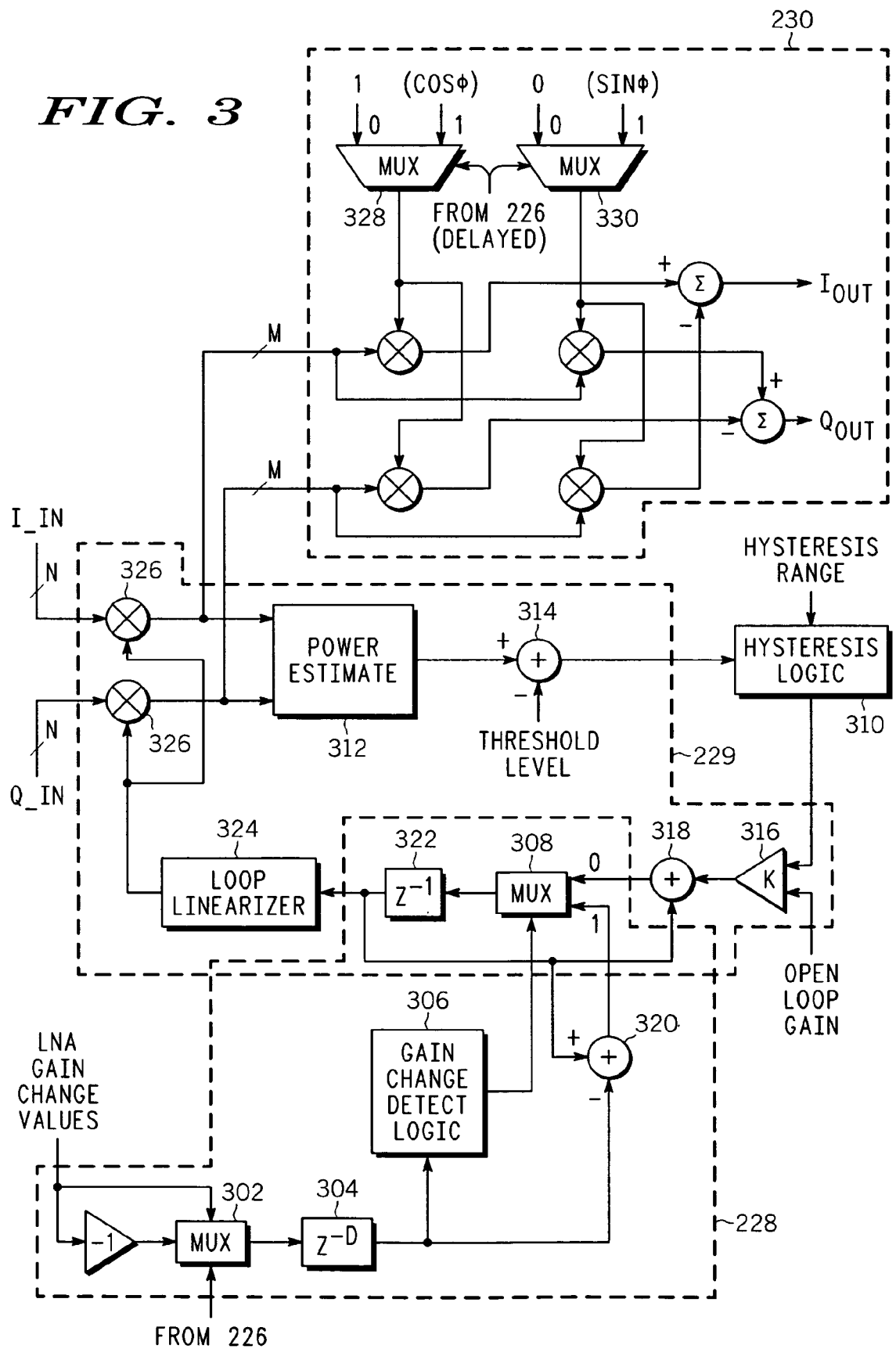
FIG. 3 is a block diagram of a digital gain normalization loop and a digital phase compensation block of the receiver of FIG. 2 in accordance with a preferred embodiment of the present invention.

Referring to FIG. 3, details of the digital gain normalization loop 229, the digital gain compensation block 228 and the digital phase compensation block 230 are shown. The N-bit digital signal from the digital channel filters 224 are first processed by the digital gain normalization loop 229. The digital gain normalization loop 229 dynamically normalizes the N-bit digital signal to a smaller output signal range (M bits wide), M being much less than N. While in the preferred embodiment of the present invention, the value of M is much less than the value of N, the present invention can utilize values of M less than or equal to N. Where M is equal to N, gain compensation in accordance with the present invention is accomplished without the digital gain normalization loop. The digital gain normalization loop advantageously allows for smooth adaptation of the N-bit digital signal into the output signal range without causing large abrupt step changes in the M-bit digital signal. The dynamic gain compensation for the LNA state changes is performed within the feedback path of the digital gain normalization loop. Also, after conversion of the N-bit digital signal to the smaller M-bit range, dynamic phase compensation for LNA state changes is performed in the digital phase compensation block 230.

The digital gain normalization loop 229 includes the multipliers 326 in the two quadrature channel paths which utilize the feedback loop to extract the more important M bits of the N-bit signal by moving weak signals up in the bits, thereby dynamically normalizing the N-bit digital signal to an M-bit digital signal. Signals indicating the power level of the M-bit digital signal as determined by the power estimate block 312 are supplied to a threshold level comparator 314 for comparing the power signal to a predetermined power threshold level (in dB). The resultant signal is supplied to hysteresis logic 310 which also receives a predetermined hysteresis range signal (in dB) for examination of the signal. The output of the hysteresis logic 310 is utilized to reduce chatter in the feedback path and is input to a K multiplier 316, where K is chosen in response to how fast the digital gain normalization loop 229 settles. The value of K determines the open loop gain. The output of the K multiplier 316 is provided to the loop integrator which consists of accumulator 318, register 322 and the feedback path therebetween. The loop filter of the dynamic gain normalization loop 229 includes the K multiplier 316 and the loop integrator. This loop filter controls the loop dynamics of the dynamic gain normalization loop 229. The output of the loop integrator is supplied to a loop linearizer 324 before feeding it to the multipliers 326. The loop linearizer 324 performs scaling of the gain normalization multipliers 326 on a logarithmic scale to linearize the control loop.

The LNA state changes at any given time is determined by the switched LNA gain change compensation block 228 and is input as LNA gain change values in response to an LNA gain control signal from the RF gain control unit 226 received at a multiplexer 302. The LNA gain change values input into the multiplexer 302 may be calibrated during the factory phasing of the radio. Alternately, if the LNA gain changes do not vary much from part to part, these values may be simply derived from the characterization data of the LNA to avoid this factory phasing process.

The LNA gain change value (either a positive or a negative gain compensation value depending upon the current LNA state) is first delayed by a predetermined delay at delay block 304. This LNA gain change value is in units of decibels since logarithmic scaling is applied at the gain normalization multipliers 326 to linearize the control loop. The predetermined delay corresponds to a time duration for a signal to travel from the LNA stages 212 to the input of the digital gain normalization multipliers 326. It is necessary to properly time align the digital gain compensation with the LNA state change to avoid undesirable transients during the indicated delay time duration. Following the fixed delay block 304, a gain change detect logic block 306 generates a change detect pulse to be able to dynamically load a LNA gain change compensated value into the loop integrator register 322 of the digital gain normalization loop. At the same time this load pulse is generated, the loop integrator register 322 is dynamically updated with a new value combining the LNA gain change compensation value with the current value in the register 322, thereby biasing the current content of register 322 by the LNA gain change value. The effect of this compensation is that it minimizes the gain transient that can otherwise occur at the output of the digital gain normalization unit 228. Such a transient can otherwise occur due to unit 228 having to track out a large LNA gain change (e.g., >16 dB) at its input.

The output of the delay block 304 is also fed into the adder 320 and thence to MUX 308 to subtract the LNA gain change, thereby dynamically changing the loop integrator register 322 by subtracting what is added thereto.

Following normalization of the input signal to the smaller M-bit signal range by the digital gain normalization loop 229, the LNA phase compensation unit 230 is used to compensate for a known phase shift due to LNA state changes to improve receiver performance under fast fading conditions by utilization of LNA phase compensation values input into multiplexers 328 and 330. Similar to the LNA gain replacement values derivation, the LNA phase compensation values can be derived from a radio level factory calibration process. Alternately, if the LNA phase shifts do not vary much from part to part, these values may be simply derived from the characterization data of the LNA to avoid the indicated factory phasing process. The calibrated phase shift value can then be used to dynamically compensate for LNA state changes after a fixed delay following a LNA state change event. The dynamic phase compensation needs to be delayed relative to the LNA state change to compensate for the actual delay from the LNA stage to where the phase compensation actually occurs in the digital signal path (i.e., after the digital gain normalization multipliers 326). This is necessary to avoid large phase change transients that can otherwise occur during this period. The delay is accomplished by delaying the LNA gain control signal from the RF gain control system 226 before utilizing it to control the operation of multiplexers 328 and 330. This can be implemented through a delay block or other means well known to those skilled in the art. In the preferred embodiment of the present invention, the digital phase compensation is performed in accordance with a digital complex phase shift operation on the quadrature signal at the output of the digital gain normalization loop 228. Thus, the calibrated LNA phase shift can be applied to the input signal through the circuitry of the digital phase compensation block 230 using a complex multiply of the input signal by $e^{-j*phi}$ where phi is a predetermined phase shift quantity. Given that I_in and Q_in are the quadrature input signals, the phase shifted outputs are computed as:

$I\_out = I\_in*\cos(phi) + Q\_in*\sin(phi)$ $Q\_out = Q\_in*\cos(phi) - I\_in*\sin(phi)$ where I_out and Q_out are outputs of this LNA phase compensation unit 230. These outputs can easily be computed given that the cos(phi) and sin(phi) are pre-programmed values which reflect the cosine and sine of the calibrated phase shift for each LNA stage 212.

Figure 4:
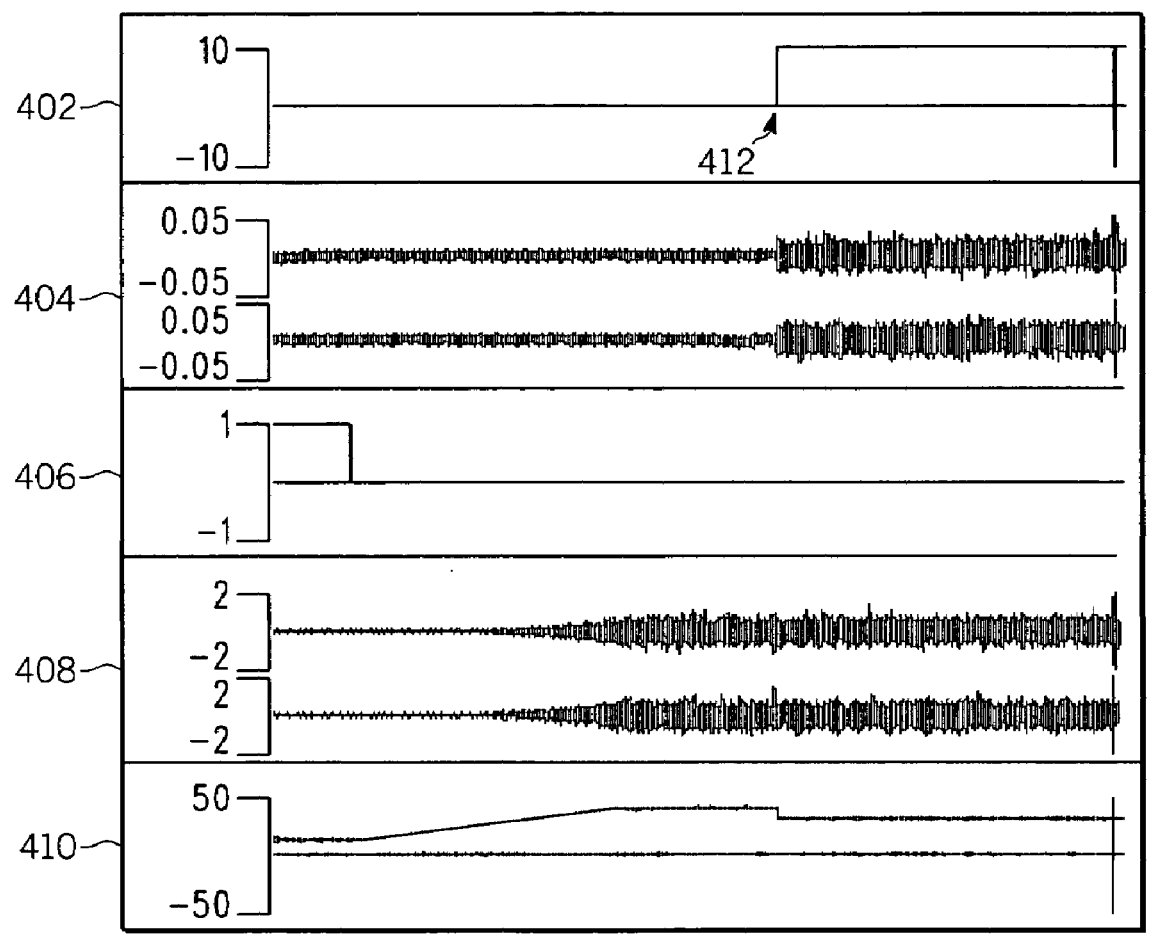
FIG. 4 are graphs of the signals passing through the RF circuitry of FIG. 2 with the digital gain normalization loop tracking of the LNA state changes in accordance with the preferred embodiment of the present invention.

Referring to FIG. 4, an example 400 of the tracking behavior of the digital gain normalization loop 326, 312, 314, 310, 316, 318, 322 and 324 with a LNA 212 state change applied is shown. The RF/IF gain adjustment signal in dB is shown in plot 402, the digital gain normalization loop 228 input signal is shown in plot 404, the clear signal for the digital gain normalization loop 228 is shown in plot 406, the digital gain normalization loop 228 output signal is shown in plot 408, and the digital gain applied is shown in plot 410. After the gain normalization loop's clear signal is deasserted, the loop tracks the weak input signal until the desired signal strength (or programmed operating point of the loop) is reached at the loop output. The gain applied during this tracking is linear in a dB scale. After the desired operating point is reached, a large RF gain change step due to an LNA state change is applied at time 412 in this simulation. When this large RF gain change is applied, a transient is not observed at the loop output. This is due to the time aligned dynamic gain compensation that is applied within the feedback path of the gain normalization loop 228 to eliminate such undesirable transients.

Figure 5:
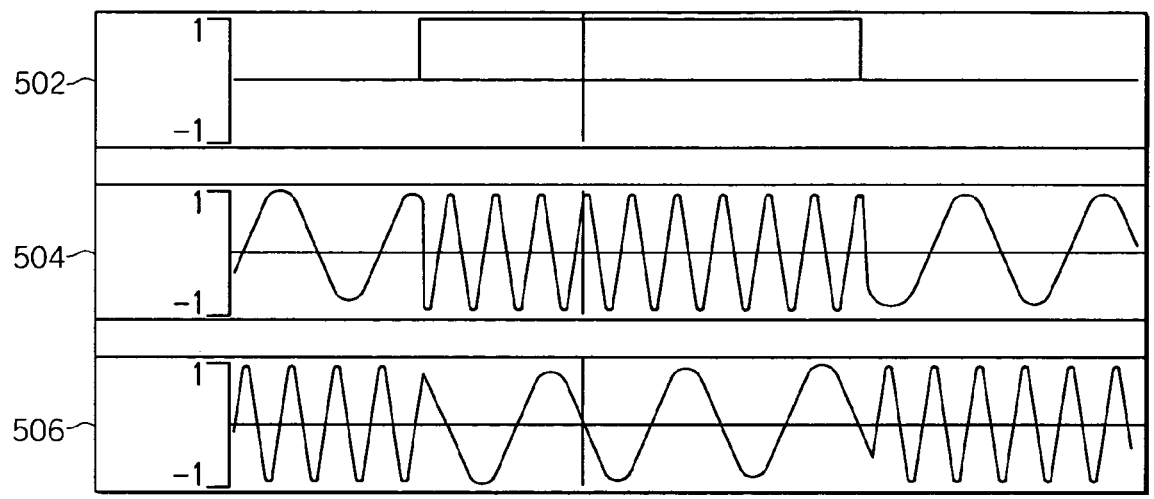
FIG. 5 are graphs of the dynamic phase compensation of the RF circuitry of FIG. 2 while compensating for ninety degree phase shifts in accordance with the preferred embodiment of the present invention.
Figure 6:
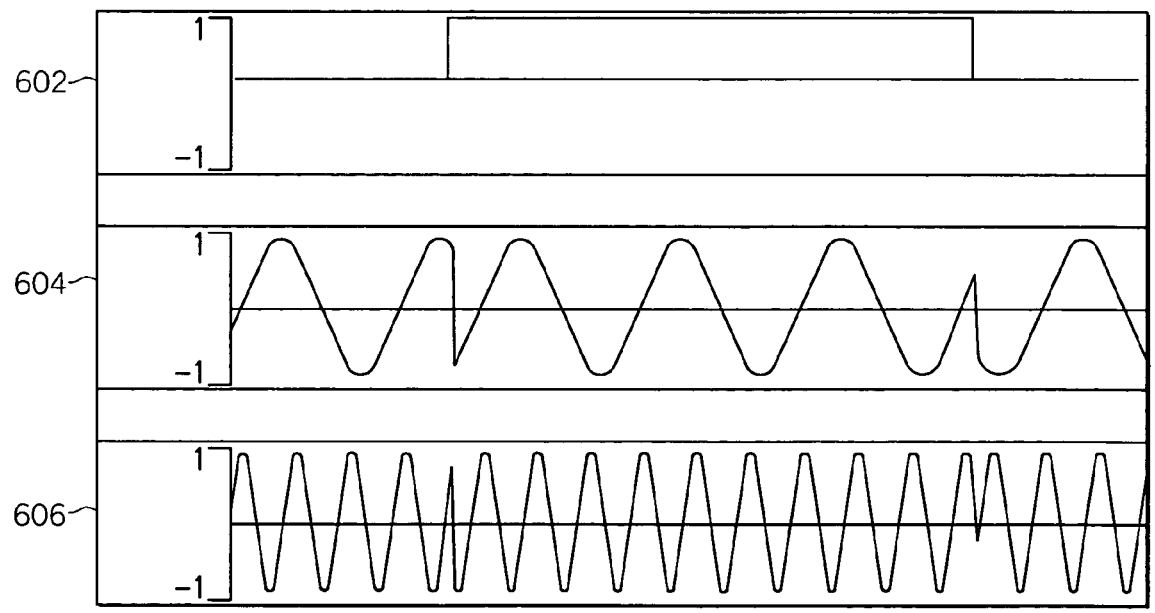
FIG. 6 are graphs of the dynamic phase compensation of the RF circuitry of FIG. 2 while compensating for one hundred and eighty degree phase shifts in accordance with the preferred embodiment of the present invention.

FIGS. 5 and 6 illustrate the effects of ninety degrees phase compensation 500 and one hundred and eighty degrees phase compensation 600 at the output of the LNA digital phase compensation block 230 to compensate for LNA phase shifts. The first plot 502, 602 shows the state of a 1-bit switched LNA control signal when such dynamic compensations are applied. The second (Iout) 504, 604 and third (Qout) 506, 606 curves show the I and Q quadrature signals at the output of the LNA phase compensation block.

Thus it can be seen that the improved method and apparatus for dynamic gain and phase compensation of the present invention compensates for large gain and phase discontinuities in a controlled manner to avoid gain transients and phase discontinuities which can otherwise occur.

Therefore, the present invention includes a method for improved gain compensation in a radio frequency (RF) receiver receiving an RF signal. The receiver has an RF/intermediate frequency (IF) path including at least one RF/IF analog stage coupled to an RF gain control unit, the RF gain control unit providing a gain control signal to the at least one RF/IF analog stage for control thereof. The RF receiver further includes an analog-to-digital (A/D) converter for digitizing the RF signal and outputting a signal to the RF gain control unit. The method for gain compensation includes the step of dynamically adjusting the signal to compensate for the at least one RF/IF analog stage in response to the gain control signal. Where the signal is an N-bit digital signal, the method also includes the step of dynamically normalizing the N-bit digital signal into an M-bit signal range to derive an M-bit digital signal, where $M \leq N$. In a receiver where the at least one RF/IF analog stage includes at least one switched LNA, at least one mixer, or at least one baseband gain control stage, the step of dynamically adjusting the signal includes the step of dynamically adjusting the signal to compensate for the at least one switched LNA, the at least one mixer, or the at least one baseband gain control stage, respectively, in response to the gain control signal.

The step of dynamically adjusting the signal of the present invention also includes the step of dynamically adjusting the signal to compensate for the at least one RF/IF analog stage in response to the gain control signal and a gain change value associated with the at least one RF/IF analog stage where the gain change value is a predetermined value derived from either characterization data of the at least one RF/IF analog stage. is a predetermined value calibrated during factory processing of the RF receiver.

The RF receiver also includes a register coupled to the A/D converter and the step of dynamically adjusting the digital signal comprises the step of dynamically loading into the register a combination of the gain change value and a current value in the register. In addition, the receiver includes a gain change detect logic block for generating a change detect pulse and the step of dynamically loading the combination of the gain change value and the current value into the register comprises the step of dynamically loading the combination into the register in response to the change detect pulse. Also, the RF receiver includes a gain compensation unit for performing the gain compensation, the gain compensation unit comprising the register, and the step of dynamically loading the combination of the gain change value and the current value into the register comprises the step of dynamically loading the combination into the register after a predetermined delay corresponding to a time duration for a signal to travel from the at least one RF/IF analog stage to the gain compensation unit.

The present invention also includes a method for improved phase compensation in a radio frequency (RF) receiver receiving an RF signal, the RF receiver having an RF intermediate frequency path including at least one RF/IF analog stage coupled to an RF gain control unit, the RF gain control unit providing a gain control signal to the at least one RF/IF analog stage for control thereof. The RF receiver further includes an analog-to-digital (A/D) converter for digitizing the RF signal and outputting an N-bit digital signal to the RF gain control unit and the improved method includes the steps of dynamically normalizing the N-bit digital signal into an M-bit signal range to derive an M-bit digital signal, where $M \leq N$, and dynamically phase adjusting the M-bit digital signal to compensate for the at least one RF/IF analog stage in response to the gain control signal.

The receiver also includes a phase compensation unit for performing the phase compensation and the step of dynamically phase adjusting the M-bit digital signal comprises the step of dynamically phase adjusting the M-bit digital signal to compensate for the at least one RF/IF analog stage in response to the gain control signal and a phase change value associated with the at least one RF/IF analog stage and a predetermined time period corresponding to a time duration following the gain control signal for a signal to travel from the at least one RF/IF analog stage to the phase compensation unit. In addition, the step of dynamically phase adjusting the M-bit digital signal includes the step of dynamically phase adjusting the M-bit digital signal in accordance with a digital complex phase shift operation.

In accordance with the present invention, the step of dynamically phase adjusting the M-bit digital signal includes the step of dynamically phase adjusting the M-bit digital signal to compensate for the at least one RF/IF analog stage in response to the gain control signal and a phase change value associated with the at least one RF/IF analog stage, where the phase change value is a predetermined value derived from characterization data of the at least one RF/IF analog stage or a predetermined value calibrated during factory processing of the receiver.

Accordingly, an RF receiver of the present invention includes at least one RF/intermediate frequency (IF) analog stage for processing an analog signal, an analog-to-digital (A/D) converter coupled to the at least one RF/IF analog stage for converting the analog signal to a digital signal, an RF gain control unit coupled to the A/D converter for receiving the digital signal therefrom and generating a gain control signal in response thereto, wherein the RF gain control unit is also coupled to the at least one RF/IF analog stage for providing the gain control signal thereto for control thereof, and a digital gain normalization loop coupled to the A/D converter and the RF gain control unit for dynamically normalizing the N-bit digital signal into an M-bit signal range to derive an M-bit digital signal, where $M \leq N$. The RF receiver also includes a digital gain compensation unit coupled to the RF gain control unit for dynamically gain adjusting the N-bit digital signal to compensate for the at least one RF/IF analog stage in response to the gain control signal and a digital phase compensation unit coupled to the digital gain normalization loop and the RF gain control unit for dynamically phase adjusting the M-bit digital signal to compensate for the at least one RF/IF analog stage in response to the gain control signal.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for gain compensation in a radio frequency (RF) receiver having an RF/intermediate frequency (IF) path including at least one RF/IF analog stage coupled to an RF gain control unit, the at least one RF/IF analog stage including a plurality of components, each of the plurality of components having one or more states, the RF receiver further including an analog-to-digital (A/D) converter, the method comprising the steps of:
   receiving an RF signal;
   dynamically adjusting the one or more states of one or more of the plurality of components of the at least one RF/IF analog stage;
   the A/D converter digitizing the RF signal to derive a digital signal;
   providing the digital signal to the RF gain control unit;
   the RF gain control unit generating a gain control signal in response to the digital signal; and
   dynamically adjusting the digital signal from the A/D converter to compensate for adjusting the one or more states of the one or more of the plurality of components of the at least one RF/IF analog stage in response to the gain control signal and a gain change value associated with the at least one RF/IF analog stage.

2. The method of claim 1 wherein the digital signal is an N-bit digital signal, the method further comprising after the step of the A/D converter digitizing the RF signal the step of dynamically normalizing the N-bit digital signal into an M-bit signal range to derive an M-bit digital signal by moving weak signals up in bits of the N-bit digital signal to extract a more important M bits of the N-bit digital signal, wherein $M<N$, and wherein the step of dynamically adjusting the digital signal comprises the step of dynamically adjusting the M-bit digital signal in response to the gain control signal and the gain change value associated with the at least one RF/IF analog stage to compensate for adjusting the one or more states of the one or more of the plurality of components of the at least one RF/IF analog stage.

3. The method of claim 1 wherein the plurality of components of the at least one RF/IF analog stage comprises a plurality of switched Low Noise Amplifier (LNA) stages, and wherein the step of dynamically adjusting the one or more states of one or more of the plurality of components comprises the step of dynamically adjusting a state of the plurality of switched LNA stages by turning off one or more of the plurality of switched LNA stages, and wherein the step of dynamically adjusting the digital signal comprises the step of dynamically adjusting the digital signal in response to the gain control signal and the gain change value associated with the at least one RF/IF analog stage to compensate for the state of the plurality of switched LNA stages when one or more of the plurality of switched LNA stages are turned off.

4. The method of claim 1 wherein the plurality of components of the at least one RF/IF analog stage comprises at least one mixer, and wherein the step of dynamically adjusting the one or more states of one or more of the plurality of components comprises the step of dynamically adjusting states of the at least one mixer, and wherein the step of dynamically adjusting the digital signal comprises the step of dynamically adjusting the digital signal to compensate for dynamically adjusted states of the at least one mixer in response to the gain control signal and the gain change value associated with the at least one mixer.

5. The method of claim 1 wherein the plurality of components of the at least one RF/IF analog stage comprises at least one baseband gain control stage, and wherein the step of dynamically adjusting the one or more states of one or more of the plurality of components comprises the step of dynamically adjusting states of the at least one baseband gain control stage, and wherein the step of dynamically adjusting the digital signal comprises the step of dynamically adjusting the digital signal to compensate for dynamically adjusted states of the at least one baseband gain control stage in response to the gain control signal and the gain change value associated with the at least one baseband gain control stage.

6. The method of claim 1 wherein the gain change value is a predetermined value derived from characterization data of the at least one RF/IF analog stage.

7. The method of claim 1 wherein the gain change value is a predetermined value calibrated during factory processing of the RF receiver.

8. The method of claim 1 wherein the RF receiver further comprises a register coupled to the A/D converter and wherein the step of dynamically adjusting the digital signal comprises the step of dynamically loading into the register a combination of the gain change value and a current value in the register.

9. The method of claim 8 wherein the RF receiver further comprises a gain change detect logic block for generating a change detect pulse and wherein the step of dynamically loading the combination of the gain change value and the current value into the register comprises the step of dynamically loading the combination of the gain change value and the current value into the register in response to the change detect pulse.

10. The method of claim 8 wherein the RF receiver further comprises a gain compensation unit for performing gain compensation, the gain compensation unit comprising the register, and wherein the step of dynamically loading the combination of the gain change value and the current value into the register comprises the step of dynamically loading the combination into the register after a predetermined delay corresponding to a time duration for a signal to travel from the at least one RF/IF analog stage to the gain compensation unit.

11. A method for phase compensation in a radio frequency (RF) receiver having an RF intermediate frequency path including at least one RF/IF analog stage coupled to an RF gain control unit, the at least one RF/IF analog stage including a plurality of components, each of the plurality of components having one or more states, the RF receiver further including an analog-to-digital (A/D) converter, the method comprising the steps of:
 receiving an RF signal;
 dynamically adjusting one or more of the states of one or more of the plurality of components of the at least one RF/IF analog stage;
 the A/D converter digitizing the RF signal to derive an N-bit digital signal;
 dynamically normalizing the N-bit digital signal into an M-bit signal range to derive an M-bit digital signal by moving weak signals up in bits of the N-bit digital signal to extract a more important M bits of the N-bit digital signal, wherein M<N;
 providing the M-bit digital signal to the RF gain control unit;
 the RF gain control unit generating a gain control signal in response to the M-bit digital signal; and
 dynamically phase adjusting the M-bit digital signal to compensate for adjusting the one or more of the states of the one or more of the plurality of components of the at least one RF/IF analog stage in response to the gain control signal and a phase change value associated with the at least one RF/IF analog stage.

12. The method of claim 11 wherein the phase change value is a predetermined value derived from characterization data of one or more of the plurality of components of the at least one RF/IF analog stage.

13. The method of claim 11 wherein the phase change value is a value calibrated during factory processing of the RF receiver.

14. The method of claim 11 wherein the RF receiver further comprises a phase compensation unit for performing the phase compensation and wherein the step of dynamically phase adjusting the M-bit digital signal comprises the step of dynamically phase adjusting the M-bit digital signal to compensate for adjusting the one or more of the states of the one or more of the plurality of components of the at least one RF/IF analog stage in response to the gain control signal and the phase change value associated with the at least one RF/IF analog stage and a predetermined time period corresponding to a time duration following generation of the gain control signal for a signal to travel from the at least one RF/IF analog stage to the phase compensation unit.

15. The method of claim 11 wherein the step of dynamically phase adjusting the M-bit digital signal comprises the step of dynamically phase adjusting the M-bit digital signal in accordance with a digital complex phase shift operation.

16. A radio frequency (RF) receiver comprising:
 an antenna;
 at least one RF/intermediate frequency (IF) analog stage coupled to the antenna for processing an analog signal;
 an analog-to-digital (A/D) converter coupled to the at least one RF/IF analog stage for converting the analog signal to a digital signaL
 an RF gain control unit coupled to the A/D converter for receiving the digital signal therefrom and generating a gain control signal in response thereto, wherein the RF gain control unit is also coupled to the at least one RF/IF analog stage for providing the gain control signal thereto for control thereof; and
 a digital gain normalization loop coupled to the A/D converter and the RF gain control unit for dynamically normalizing the N-bit digital signal into an M-bit signal range to derive an M-bit digital signal, wherein M<N, wherein the digital gain normalization loop comprises one or more mixers, each of the one or more mixers having a first input coupled to receive the N- bit digital signal and a second input coupled to an output of the one of the one or more mixers to form a feedback loop, and wherein the feedback loop extracts the more important M bits of the N-bit digital signal by moving weak signals up in bits of the N-bit digital signal to dynamically normalize the N-bit digital signal into the M-bit signal range.

17. The RF receiver in accordance with claim 16 further comprises a digital gain compensation unit coupled to the RF gain control unit and dynamically gain adjusting the M-bit digital signal to compensate for the at least one RF/IF analog stage in response to the gain control signal.

18. The RF receiver in accordance with claim 17 further comprising a digital phase compensation unit coupled to the digital gain normalization loop and the RF gain control unit, wherein the digital phase compensation unit dynamically phase adjusts the M-bit digital signal to compensate for the at least one RF/IF analog stage in response to the gain control signal.

* * * * *

UNITED STATES PATENT AND TRADEMARK OFFICE
CERTIFICATE OF CORRECTION

PATENT NO. : 7,486,941 B2  Page 1 of 1
APPLICATION NO. : 11/099278
DATED : February 3, 2009
INVENTOR(S) : Rahman et al.

It is certified that error appears in the above-identified patent and that said Letters Patent is hereby corrected as shown below:

Column 10, line 31, "signaL" should be changed to --signal;--.

Signed and Sealed this

Nineteenth Day of May, 2009

JOHN DOLL
*Acting Director of the United States Patent and Trademark Office*